(12) United States Patent
Schmidt et al.

(10) Patent No.: US 9,337,186 B2
(45) Date of Patent: May 10, 2016

(54) SEMICONDUCTOR DEVICE AND A METHOD FOR MANUFACTURING A SEMICONDUCTOR DEVICE HAVING A SEMI-INSULATING REGION

(71) Applicant: Infineon Technologies AG, Neubiberg (DE)

(72) Inventors: Gerhard Schmidt, Wernberg (AT); Daniel Schloegl, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/503,749

(22) Filed: Oct. 1, 2014

(65) Prior Publication Data
US 2015/0014815 A1   Jan. 15, 2015

Related U.S. Application Data

(63) Continuation of application No. 12/938,920, filed on Nov. 3, 2010, now Pat. No. 8,884,378.

(51) Int. Cl.
| H01L 29/06 | (2006.01) |
| H01L 27/06 | (2006.01) |
| H01L 29/66 | (2006.01) |
| H01L 29/861 | (2006.01) |

(52) U.S. Cl.
CPC ........ *H01L 27/0676* (2013.01); *H01L 29/0638* (2013.01); *H01L 29/0661* (2013.01); *H01L 29/66136* (2013.01); *H01L 29/66325* (2013.01); *H01L 29/8613* (2013.01)

(58) Field of Classification Search
CPC ............ H01L 29/0619; H01L 29/0638; H01L 29/7811
USPC .................... 257/E29.012, E29.104, E29.338
See application file for complete search history.

(56) References Cited

U.S. PATENT DOCUMENTS

| 5,039,358 A | 8/1991 | Birkle et al. |
| 5,060,047 A | 10/1991 | Jaume et al. |
| 5,393,995 A | 2/1995 | Nakagawa et al. |
| 7,187,058 B2 | 3/2007 | Schmidt |
| 7,960,783 B2 | 6/2011 | Darwish et al. |
| 2002/0053718 A1 | 5/2002 | Stoisiek |
| 2005/0194662 A1 | 9/2005 | Schmidt et al. |
| 2009/0008723 A1 | 1/2009 | Schmidt |
| 2010/0044825 A1 | 2/2010 | Schmidt |

FOREIGN PATENT DOCUMENTS

| DE | 3542166 A1 | 6/1987 |
| DE | 10328578 B4 | 7/2006 |
| DE | 102005020091 A1 | 11/2006 |

*Primary Examiner* — John C Ingham
(74) *Attorney, Agent, or Firm* — Murphy, Bilak & Homiller, PLLC

(57) ABSTRACT

A semiconductor device and a method for forming a semiconductor device are provided. The semiconductor device includes a semiconductor body including a diode-structure with a pn-junction, and an edge-termination structure arranged in a peripheral area of the semiconductor body. The edge-termination structure includes an insulating region partially arranged in the semiconductor body adjacent the pn-junction and a semi-insulating region arranged on the insulating region and spaced apart from the semiconductor body. The semi-insulating region forms a resistor connected in parallel with the diode-structure.

19 Claims, 19 Drawing Sheets

US 9,337,186 B2

SEMICONDUCTOR DEVICE AND A METHOD FOR MANUFACTURING A SEMICONDUCTOR DEVICE HAVING A SEMI-INSULATING REGION

PRIORITY CLAIM

This application is a continuation of U.S. application Ser. No. 12/938,920 filed 3 Nov. 2010, the content of said application incorporated herein by reference in its entirety.

FIELD OF THE TECHNOLOGY

This specification refers to embodiments of semiconductor devices, and in particular to power semiconductor devices having an edge-termination structure and embodiments of manufacturing methods for such devices.

BACKGROUND

Many functions of modern devices in automotive, consumer and industrial applications such as converting electrical energy and driving an electric motor or an electric machine rely on semiconductor devices. It is often desirable that rectifying semiconductor devices such as diodes and IGBTs (Insulated Gate Bipolar Transistors) have a sufficiently high blocking capability. Accordingly, their rectifying pn-junction or pn-junctions are often desired to withstand sufficiently high reverse voltages. Unfavorable dimensioning may result in avalanche generation close to or at points where the rectifying pn-junctions reaches a surface of the semiconductor material. Accordingly, blocking capability may be reduced to values well below the value of the bulk breakthrough voltage of the semiconductor material.

To minimize reduction of blocking capability due to rectifying pn-junctions which approach a surface of the semiconductor device, planar edge-termination structures and/or vertical edge-termination structures may be used, typically in a peripheral area of the semiconductor device, to redistribute the electric field in the blocking mode.

Planar edge-termination structures such as field plates, guard-ring structures or channel stop regions may be arranged on a main horizontal surface of the semiconductor device. Often a combination of several edge-termination structures is used. To achieve high blocking capability and stability, a comparatively large peripheral area is typically required when planar edge-termination structures are used. Furthermore, the size of the peripheral area typically rises with rated blocking voltage. For example, for a rated blocking voltage of 600 V a field-plate with a horizontal extension of at least about 200 μm is typically used. For a rated blocking voltage of about 6.5 kV the horizontal extension of the field-plate is typically larger than about 2 mm. Accordingly, the ratio between the size of the active area for switching and/or controlling the load current and the size of the peripheral area typically decreases with increasing rated blocking voltage.

Different thereto, vertical edge-termination structures, also known as mesa edge-termination structures, typically require less space. However, forming these structures is often associated with increased processing requirements e.g. for grinding when combined with MOS-technology.

SUMMARY

According to an embodiment, a semiconductor device is provided. The semiconductor device includes a semiconductor body having a first semiconductor region and a second semiconductor region spaced apart from each other. The semiconductor device further includes a first metallization in ohmic contact with the first semiconductor region, and a second metallization in ohmic contact with the second semiconductor region. An insulating region extends between the first semiconductor region and the second semiconductor region. A semi-insulating region is spaced apart from the semiconductor body by the insulating region and electrically connects the first metallization with the second metallization. The semi-insulating region has a resistivity of about $10^3$ Ohm cm to about $10^{14}$ Ohm cm.

According to an embodiment, a semiconductor device is provided. The semiconductor device includes a semiconductor body with a diode-structure having a pn-junction. The semiconductor device further includes, in a peripheral area of the semiconductor body, an edge-termination structure having an insulating region partially arranged in the semiconductor body adjacent the pn-junction. A semi-insulating region is arranged on the insulating region and spaced apart from the semiconductor body. The semi-insulating region forms a resistor connected in parallel with the diode-structure.

According to an embodiment, a semiconductor device is provided. The semiconductor device includes a semiconductor body having a main horizontal surface, a first semiconductor region of a first conductivity type extending to the main horizontal surface, a second semiconductor region of a second conductivity type extending to the main horizontal surface, and a vertical trench. The vertical trench extends from the main horizontal surface into the semiconductor body and is arranged between the first semiconductor region and the second semiconductor region. An insulating plug is arranged in the vertical trench and extends beyond the main horizontal surface. The semiconductor device further includes a semi-insulating region, a first metallization in ohmic contact with the first semiconductor region, and a second metallization in ohmic contact with the second semiconductor region. The semi-insulating region is arranged on the insulating plug and electrically connects the first metallization with the second metallization.

According to an embodiment, a method for forming a semiconductor device is provided. The method includes providing a semiconductor body having a main horizontal surface, a horizontally extending pn-junction, and a vertical trench extending from the main horizontal surface below the horizontally extending pn-junction. A dielectric layer is formed on the main horizontal surface by spin-coating and/or ink-jet printing and/or stencil printing such that the vertical trench is at least completely filled. A second layer is formed on the dielectric layer. The second layer is selectively etched with respect to the dielectric layer to form a mask on the dielectric layer covering the vertical trench in a projection on the main horizontal surface. The dielectric layer is etched back using the second layer as mask.

According to an embodiment, a method for forming a semiconductor device is provided. The method includes providing a semiconductor body having a first semiconductor region and a second semiconductor region spaced apart from each other. An insulating region is formed such that the insulating region extends between the first semiconductor region and the second semiconductor region. A semi-insulating region having a resistivity of about $10^3$ Ohm cm to about $10^{14}$ Ohm cm is formed on the insulating region and is spaced apart from the semiconductor body. A first metallization is formed in ohmic contact with the first semiconductor region and the semi-insulating region. A second metallization is formed in ohmic contact with the second semiconductor region and the semi-insulating region.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
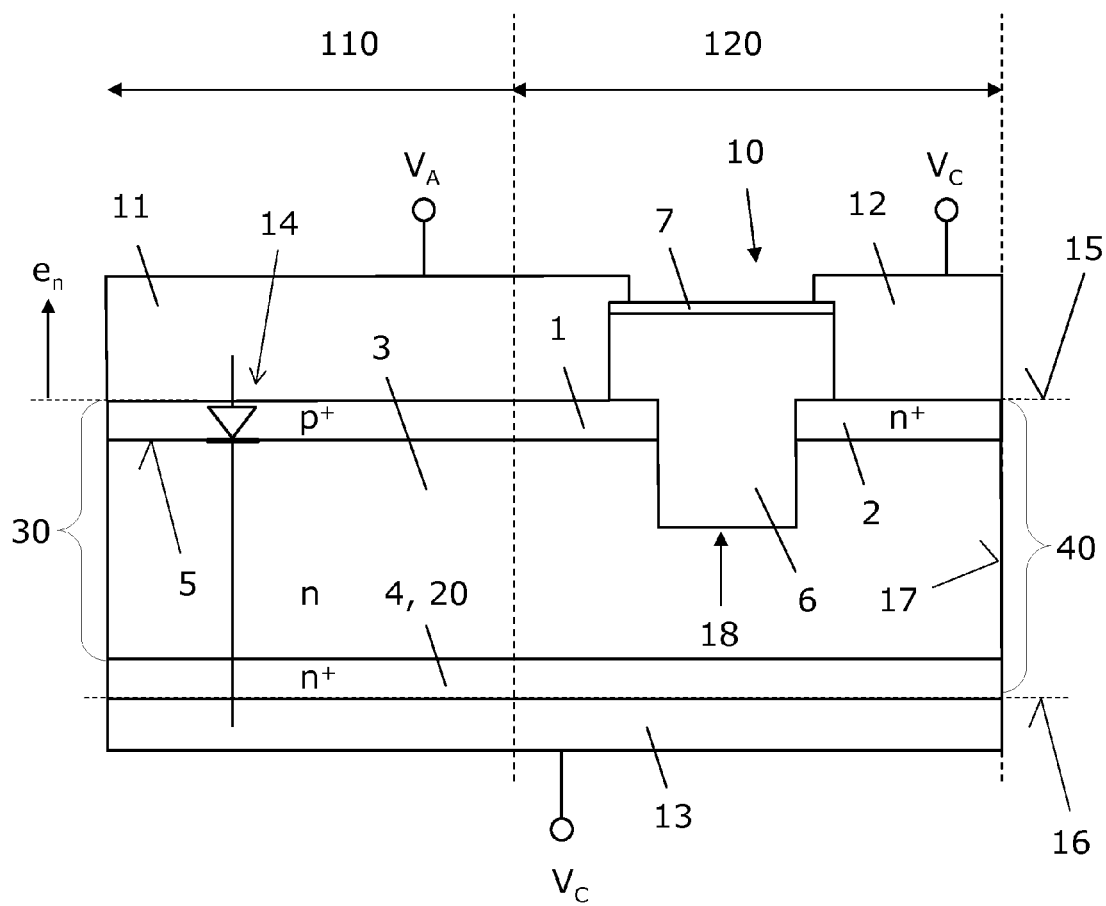
FIG. 1 schematically illustrates a vertical cross-section of a vertical semiconductor device according to one or more embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention include such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, p-doped is referred to as first conductivity type while n-doped is referred to as second conductivity type. The semiconductor devices can be formed with opposite doping relations so that the first conductivity type can be n-doped and the second conductivity type can be p-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$ regions can have different absolute doping concentrations. The same applies, for example, to an $n^+$ and a $p^+$ region.

Specific embodiments described in this specification pertain to, without being limited thereto, semiconductor devices having a field-redistributing structure, in particular to unipolar or bipolar power semiconductor devices having an active area for carrying and/or controlling a load current and a peripheral area with an edge-termination structure to redistribute the electric field and electric potential, respectively, such that the blocking voltage is increased. The semiconductor device may be a vertical semiconductor device such as a vertical diode, a vertical thyristor, a vertical IGBT, a vertical MOSFET or a vertical JFET (Junction-FET).

The term "power semiconductor device" as used in this specification intends to describe a semiconductor device on a single chip with high voltage and/or high current switching capabilities. In other words, power semiconductor devices are intended for high current, typically in the Ampere range, and/or high voltages, typically above 400 V, more typically above 600 V.

In the context of the present specification, the terms "in ohmic contact", "in electric contact", "in contact", "in ohmic connection", and "electrically connected" intend to describe that there is an ohmic electric connection or ohmic current path between two regions, portion or parts of a semiconductor devices or between different terminals of one or more devices or between a terminal or a metallization and a portion or part of a semiconductor device.

FIG. 1 illustrates an embodiment of a semiconductor device 100 in a section of a vertical cross-section. The semiconductor device 100 includes a semiconductor body 40 having a first or main horizontal surface 15 and a second surface or back surface 16 arranged opposite to the first surface 15. The normal direction $e_n$ of the first surface 15 is substantially parallel to, i.e. defines, the vertical direction.

The semiconductor body 40 can be a single bulk monocrystalline material. It is also possible, that the semiconductor body 40 includes a bulk mono-crystalline material 20 and at least one epitaxial layer 30 formed thereon. Using epitaxial layer(s) 30 provides more freedom in tailoring the background doping of the material since the doping concentration can be adjusted during deposition of the epitaxial layer or layers.

In the following, embodiments pertaining to semiconductor devices and manufacturing methods therefore, respectively, are explained mainly with reference to silicon (Si) semiconductor devices. Accordingly, a monocrystalline semiconductor region or layer is typically a monocrystalline Si-region or Si-layer. It should however be understood that the semiconductor body 40 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-resistance $R_{on}$.

Typically, semiconductor device 100 is a vertical power semiconductor device with an active area 110 for carrying and/or controlling a load current and a peripheral area 120 with an edge-termination structure 10. The peripheral area 120 extends in the shown cross-section up to a lateral edge 17, typically a sawing edge 17. Only the rightmost part of the active area 110 is illustrated in FIG. 1. The part of the active area 110 not illustrated may include a plurality of unit cells, for example a plurality of MOSFET-structures with insulated gate electrodes arranged on the main horizontal surface 15 or in trenches extending from the main horizontal surface 15 into the semiconductor body 40. Semiconductor device 100 may also form a power diode 100. As such first semiconductor region 1 may be unstructured in active area 110. For example, semiconductor device 100 may form a CAL diode (CAL=Controlled Axial Lifetime) having a heavily doped p-type emitter 1 or an EMCON diode (EMCON=Emitter Controlled) having a relatively weakly p-doped emitter 1. Semiconductor device 100 may however also form a SPEED diode (self-adjusted p-emitter efficiency diode) with a structured p-emitter 1 having weakly p-doped zones for normal operation and highly p-doped zones for surge currents.

Typically, a further peripheral area (not shown) with an edge-termination structure 10 is, in a complete cross-sectional view of semiconductor device 100, typically arranged left of the active area 110.

Semiconductor body 40 includes a $p^+$-type first semiconductor region 1 and an $n^+$-type second semiconductor region 2 which extend to the main horizontal surface 15 and are spaced apart from each other by a vertical trench 18 arranged in the peripheral area 120. Vertical trench 18 extends from main horizontal surface 15 into semiconductor body 40.

In the exemplary embodiment illustrated in FIG. 1, semiconductor body 40 further includes an n-type third semiconductor region 3 which forms a pn-junction 5 with the first semiconductor region 1. The pn-junction 5 may for example form a pn-load junction 5 of a power diode 100 or a body diode 5 of a power MOSFET 100 or a power IGBT. Accordingly, first semiconductor region 1 may form an anode region 1 or body region 1 and third semiconductor region 3 may form a base region 3 or drift region 3 in the active area 110. The second semiconductor region 2 typically forms a channel stop region 2 in the peripheral area 120 and may horizontally extend up to the sawing edge 17 of semiconductor body 40. For sake of clarity, the operating of semiconductor device 100 is mainly explained with respect to a diode 100 in the following description. Semiconductor device 100 may also form a MOSFET, an IGBT or a JFET. In these cases, the drift region 3 typically also extends to main horizontal surface 15 in active area 110.

A first metallization 11 is arranged on main horizontal surface 15 and in ohmic contact with the first semiconductor region 1. A second metallization 12 is arranged on main horizontal surface 15 and in ohmic contact with the second semiconductor region 2. Further, a third metallization 13 is arranged on back surface 16 and in ohmic contact with the third semiconductor region 3 via highly doped fourth semiconductor region 4. When semiconductor device 100 forms a MOSFET, JFET or diode, fourth semiconductor region 4 is of $n^+$-type as illustrated in FIG. 1. In case, semiconductor device 100 forms an IGBT, fourth semiconductor region 4 is of $p^+$-type. Accordingly, a load current may flow during operation between the first metallization 11 and the third metallization 13 when the pn-junction 5 is forwardly biased by applying a positive voltage difference $V_A-V_C>0$ between the first metallization 11 typically forming an anode 11 and the third metallization 13 typically forming a cathode 13.

The material of the metallizations 11, 12 and 13 is typically a metal such as Ti, W and Co but may also be a material with metallic or near metallic properties with respect to electric conductivity such as highly doped n-type or p-type poly-Si, TiN or an electrically conductive silicide such as $WSi_2$. The first, second and third metallizations 11, 12, 13 are in the following also referred to as first conductive region 11, second conductive region 12 and third conductive region 13, respectively.

The third metallization 13 is typically in low ohmic contact or short circuited with the second metallization 12. This may be achieved by appropriately high doping concentrations of the n-type semiconductor regions 2, 3 and 4, e.g. in respective portions close to the sawing edge 17, a further conductive region or metallization on the sawing edge 17 and/or by an external wiring. During operation, the second and third metallizations 12, 13 are typically on the same potential $V_C$.

The dopant dose introduced into the p-type first semiconductor region 1 is for power semiconductor devices typically higher than the breakdown charge of the semiconductor material used, which ranges, depending on rated blocking capability, from about $10^{12}$ cm$^{-2}$ to about $10^{14}$ cm$^{-2}$ for silicon. A resultant maximum doping concentration of the first semiconductor region 1 thus lies between about $10^{15}$ cm$^{-3}$ and about $10^{19}$ cm$^{-3}$, for example, depending on its vertical dimensions. The maximum doping concentration in the n-type second semiconductor region 2 is for example in the range between about $10^{18}$ cm$^{-3}$ and about $10^{20}$ cm$^{-3}$, and that in the n-type third semiconductor region 3 typically lies between about $1*10^{14}$ cm$^{-3}$ and about $5*10^{14}$ cm$^{-3}$, for example in the region of about $1.5*10^{14}$ cm$^{-3}$. The maximum doping concentration of the n-type fourth semiconductor region 4 typically ranges between about $10^{15}$ cm$^{-3}$ and about $10^{20}$ cm$^{-3}$. The doping relations of the semiconductor regions may also be reversed.

In the exemplary embodiment illustrated in FIG. 1, vertical trench 18 adjoins pn-junction 5 and extends partly into the third semiconductor region 3 and vertically below pn-junction 5.

Vertical trench 18 is completely filled with an insulating material forming an insulating region 6. The insulating region 6 typically extends between the first semiconductor region 1 and the second semiconductor region 2 and between the first metallization 11 and the second metallization 12. In other words, the insulating region 6 completely fills the vertical trench 18 and extends beyond the main horizontal surface 15. In still other words, the insulating region 6 is partially arranged in vertical trench 18. In the following, the insulating region 6 is also referred to as insulating plug 6.

Typically, insulating region 6 includes an organic and/or an inorganic polymer with sufficient high dielectric strength and moisture resistance. For example, the insulating region 6 includes and/or is made of a cured epoxy resin such as SU8, silicone, spin-on glass, polymerized imide such as polyimide, parylene or polymerized benzocyclobutene such as Cyclotene 3000. These materials may be applied by spin-coating or by a printing technique such as ink-jet printing and stencil printing. Accordingly, the comparatively large volume of trench 18 may efficiently be filled with a suitable dielectric material.

According to an embodiment, a semi-insulating region 7 with a resistivity of about $10^3$ Ohm cm to about $10^{14}$ Ohm cm, more typically with a resistivity of about $10^6$ Ohm cm to about $10^{12}$ Ohm cm, is arranged on insulating region 6 and spaced apart from semiconductor body 40 by insulating region 6 such that the semi-insulating region 7 connects the first metallization 11 and the second metallization 12. Since the metallizations 12 and 13 are substantially or nearly at the same electric potential $V_C$ during operation, the insulating region 6 forms a resistor which is connected in parallel to a diode 14 formed by pn-junction 5 between the anode 11 and the cathode 13. In other words, a resistor is connected in parallel to a current path which is arranged in semiconductor body 40 between the first semiconductor region 1 and the second semiconductor region 2, and which runs across pn-junction 5.

When semiconductor device 100 is in a blocking mode, i.e. when the pn-junction 5 is reversely biased, a space charge region is formed along pn-junction 5 which extends into the second semiconductor region 2 and to a lesser extend into the higher doped first semiconductor region 1. In blocking mode, the equipotential lines of the electric field cross the plane of the main horizontal surface 15 in the peripheral area 120. Due to the linear potential drop across semi-insulating region 7, the electric field close to the main horizontal surface 15 is typically reduced in the peripheral area 120 compared to similar semiconductor devices but without the edge-termination structure 10 having an insulating plug 6 and the semi-insulating region 7 arranged thereon. This is explained in more detail below with respect to FIGS. 5 to 7. Accordingly, the onset of an avalanche generation close to the main horizontal surface 15 may be avoided or at least shifted to higher voltages. In so doing, a reliable edge-termination structure 10 for power semiconductor devices with reduced lateral spacing may be provided. Furthermore, the drift of the breakdown voltage during operation due to incorporating of hot charge carriers in dielectrics may be reduced. The edge-termination structure 10 may also be combined with additional edge-termination structures such as guard rings and field plates.

To minimize leakage current, the resistivity and geometry of semi-insulating region 7 is typically chosen such that the current through semi-insulating region 7 is below 10 mA at the rated blocking voltage, more typically below 5 mA, or even below 1 mA. Accordingly, the resistance of the resistor formed by the semi-insulating region 7 is, depending on the rated blocking voltage, in a range of about 5 kOhm to about 50 MOhm, more typically in a range of about 25 kOhm to about 5 MOhm, or even higher. Typically, the resistance is higher than about 1 kOhm.

The semi-insulating region 7 can be made of, and/or includes, a non-monocrystalline semiconductor material. This may be an amorphous semiconductor material, a polycrystalline semiconductor material, a nanocrystalline semiconductor material or a stack thereof. The material of semi-insulating region 7 may be chemically different to the semiconductor material or materials of semiconductor body 40. Typically, the non-monocrystalline semiconductor material is a diamond-like carbon, a silicon carbide $Si_xC_{1-x}$ with $0<=x<=1$, an amorphous hydrogenated silicon, or an amorphous hydrogenated silicon carbide. Diamond-like carbon as material of the semi-insulating region 7 may be combined with a variety of inorganic and organic polymers as material of the insulating region 6, as diamond-like carbon is typically deposited at moderate temperatures which are compatible with the polymers. This will be explained with respect to FIGS. 8 to 16 in more detail.

Figure 2:
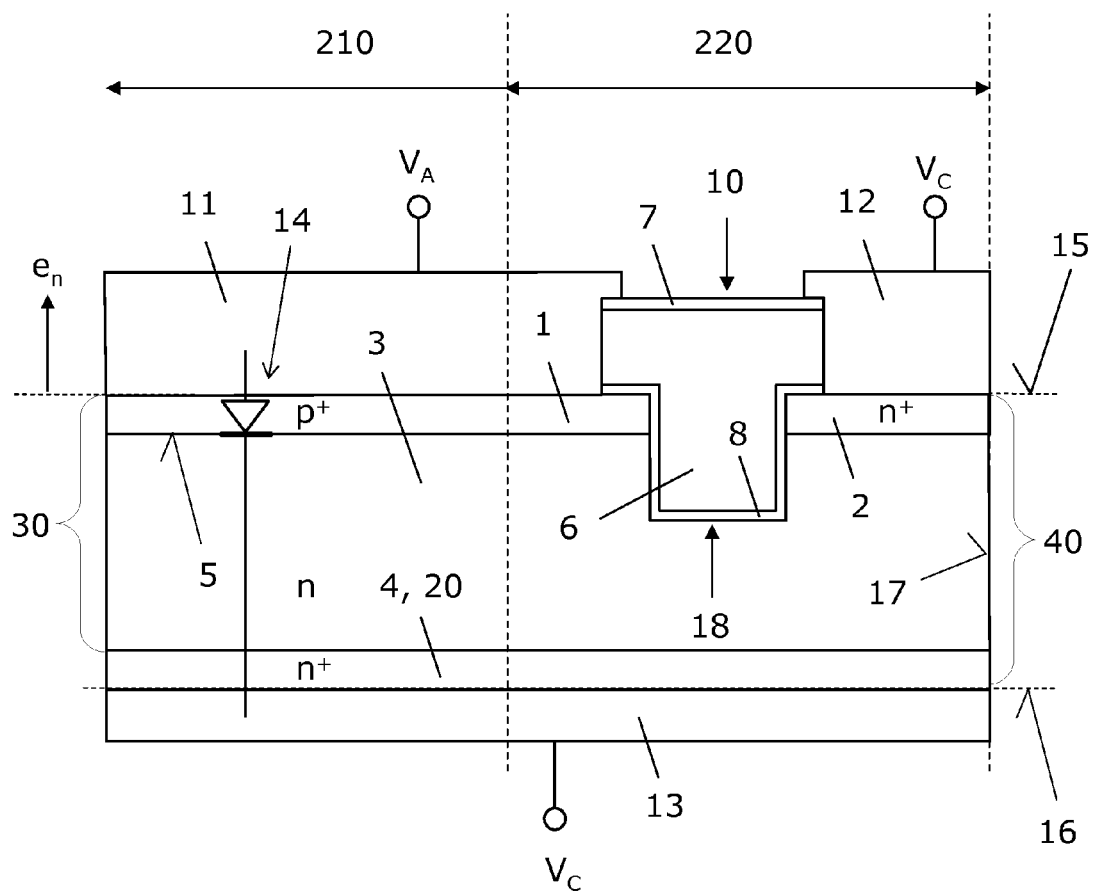
FIG. 2 schematically illustrates a vertical cross-section of a vertical semiconductor device according to one or more embodiments.

FIG. 2 illustrates an embodiment of a semiconductor device 200 in a section of a vertical cross-section. Semiconductor device 200 is similar to semiconductor device 100 and also typically a power semiconductor device with an active area 210 and a peripheral area 220. Semiconductor device 200 also includes a semiconductor body 40 with a p$^+$-type first semiconductor region 1 and an n$^+$-type second semiconductor region 2 which both extends to a main horizontal surface 15. First semiconductor region 1 and second semiconductor region 2 are in ohmic contact with a first metallization 11 and a second metallization 12, respectively. A vertical trench 18 extends in the peripheral area 220 from the main horizontal surface 15 into the semiconductor body 40 and is arranged between the first semiconductor region 1 and the second semiconductor region 2. An insulating plug 6 is arranged in the vertical trench 18 and extends beyond the main horizontal surface 15. In other words, insulating plug 6 is partly arranged in vertical trench 18. A semi-insulating region 7 is arranged on the insulating plug 6 and electrically connects the first metallization 11 and the second metallization 12. However, the insulating plug 6 of semiconductor device 200 may only partially fill vertical trench 18 when a further semi-insulating region 8, for example a diamond-like carbon layer 8, is arranged below the insulating plug 6 to form a further resistor between the first metallization 11 and the second metallization 12. In so doing, the field distribution in blocking mode of semiconductor device 200 may further be smoothed so that the break-down voltage of semiconductor device 200 may be further increased and/ or the drift of the breakdown voltage during operation reduced.

In another embodiment, region 8 of semiconductor device 200 corresponds to a thin dielectric layer 8 such as thermally formed $SiO_2$, or deposited $SiO_2$, $Si_3N_4$, $SiO_xN_y$, $Al_2O_3$, $ZrO_2$, $Ta_2O_5$, $TiO_2$ and $HfO_2$. In this embodiment, dielectric layer 8 and the insulating region 6, which typically includes a polymer as explained with reference to FIG. 1, together form the insulating plug 6, 8.

The semiconductor device 100 and 200 may also be described as semiconductor devices having a semiconductor body 40 with a first semiconductor region 1 and a second semiconductor region 2, a first metallization 11 in ohmic contact with the first semiconductor region 1, a second metallization 12 in ohmic contact with the second semiconductor region 2, a semi-insulating region 7 electrically connecting the first metallization 11 and the second metallization 12, and an insulating region 6, 8 which spaces the semi-insulating region 7 and the semiconductor body 40 from each other and which extends from the first semiconductor region 1 to the second semiconductor region 2.

Figure 3:
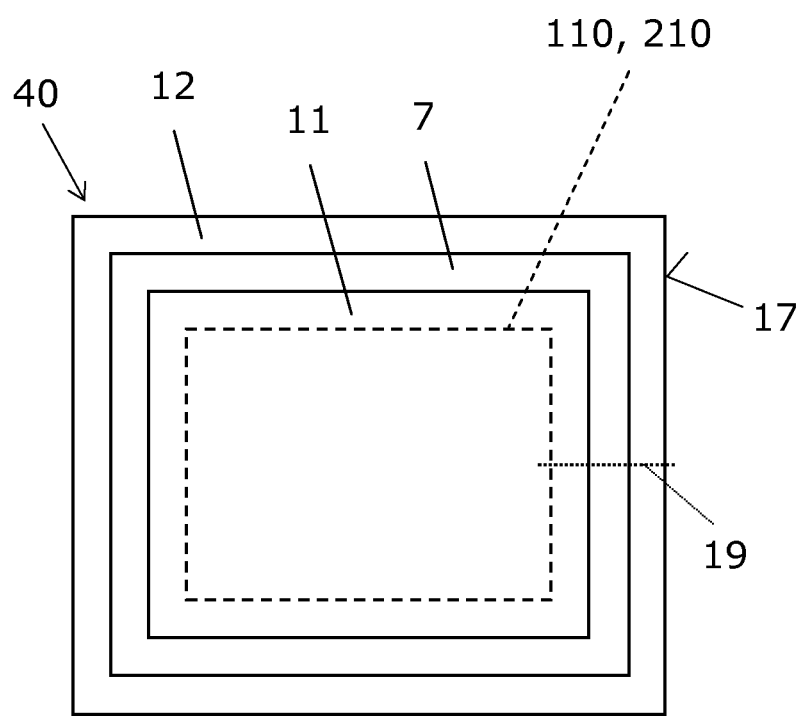
FIG. 3 schematically illustrates a plan view of a vertical semiconductor device according to one or more embodiments.

FIG. 3 illustrates a plan view of the front side of semiconductor devices 100, 200 as illustrated in FIGS. 1 and 2. The semiconductor devices 100, 200 can be formed as single chips as shown in FIG. 3. The sawing edge 17 surrounds the semiconductor body 40, which is typically rectangular in plan view, on all sides. The semiconductor body 40 additionally has an active area 110, 210 and a peripheral area arranged between the active area 110, 210 and the sawing edge 17 in a lateral direction. In plan view, only the first metallization 11 surrounded by the semi-insulating region 7 and the second metallization 12 are typically visible. The active area 110, 210 is illustrated as dashed rectangle and may include a plurality of unit cells, for example an array of DMOS unit cells, below the first metallization 11. For clarity reasons, contact pads of gate electrodes of DMOS unit cells are not shown. The peripheral area has an edge-termination structure as explained with reference to FIGS. 1 and 2. FIGS. 1 and 2 typically correspond to respective vertical sections along the dotted line 19 in FIG. 3. The edge-termination structure may completely surround the active area 110, 210.

Figure 4:
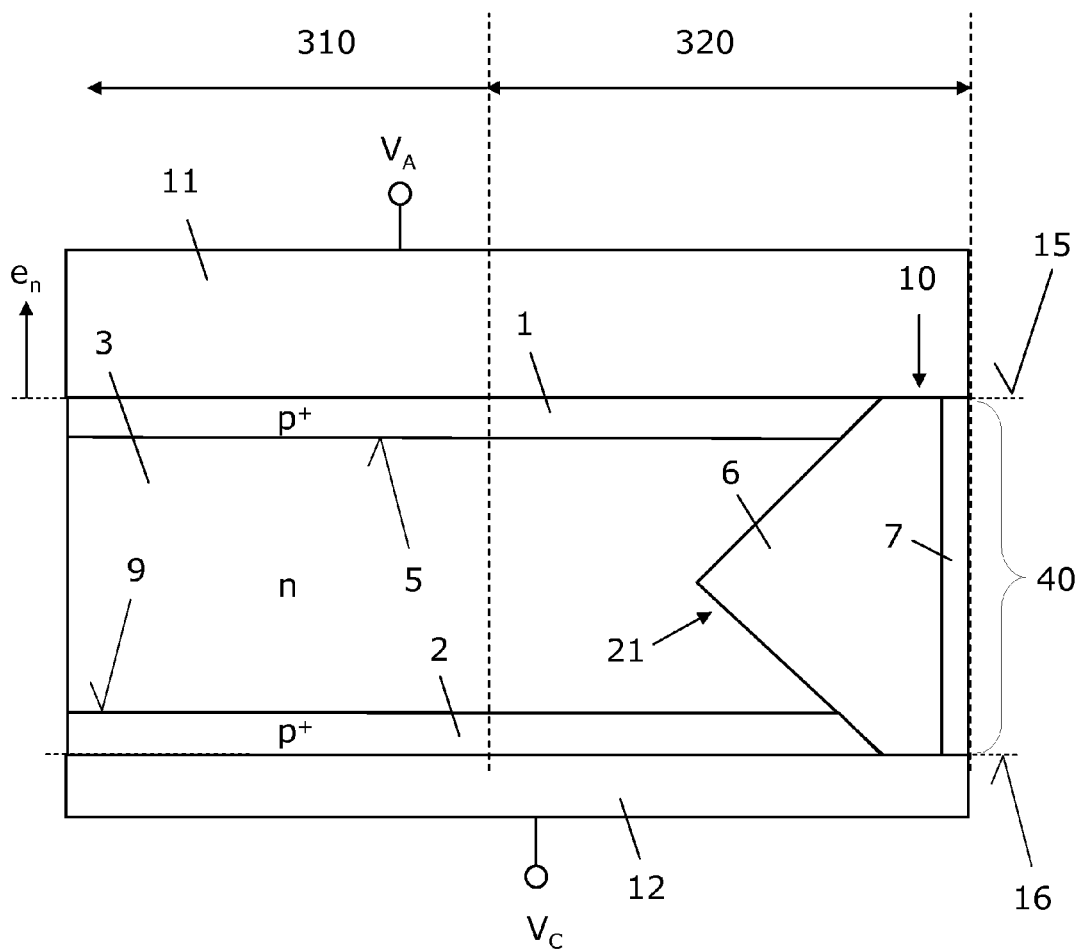
FIG. 4 schematically illustrates a vertical cross-section of a vertical semiconductor device according to one or more embodiments FIG. 5 schematically illustrates an electric potential distribution in a vertical cross-section of a vertical semiconductor device according to one or more embodiments.

FIG. 4 illustrates an embodiment of a semiconductor device 300 in a section of a vertical cross-section. Typically, semiconductor device 300 is also a power semiconductor device with an active area 310 and a peripheral area 320 which typically also circumferentially surrounds the active area 310. Semiconductor device 300 also includes a semiconductor body 40 with a $p^+$-type first semiconductor region 1 which extends to a main horizontal surface 15 and is in ohmic contact with a first metallization 11. Semiconductor device 300 has further a $p^+$-type second semiconductor region 2 which extends to a back surface 16 arranged opposite to the main horizontal surface 15. Between the first and second semiconductor regions 1, 2 an n-type third semiconductor region 3 is arranged. Accordingly, two pn-junctions 5 and 9 are arranged between the first and second metallizations 11, 12. Semiconductor device 300 may for example form an IGBT. Accordingly, the first, second and third semiconductor regions 1, 2, 3 may form in the active area 310 a body region 1, a drift region 2 and a collector region 3, respectively. Semiconductor device 300 may further include an optional n-type field-stop region which is arranged between the second semiconductor region 2 and the third semiconductor region 3.

In the peripheral area 320 an edge-termination structures 10 is arranged. The edge-termination structures 10 of semiconductor device 300 also includes an insulating region 6 and a semi-insulating region 7 arranged thereon. In the exemplary embodiment illustrated in FIG. 4, the insulating region 6 is arranged in a v-shaped groove 21 at the lateral side of semiconductor body 40. In other words, dielectric region 6 also forms an insulating plug 6 and the semi-insulating region 7 forms a resistor between the first and second metallizations 11, 12 with a resistivity which is typically in a range of about $10^3$ Ohm cm to about $10^{14}$ Ohm cm, more typically in a range of about $10^6$ Ohm cm to about $10^{12}$ Ohm cm. The dielectric region 6 typically also includes and/or is made of a polymer as explained with reference to FIGS. 1 and 2.

Semiconductor device 300 may also be described as a semiconductor device 300 with a semiconductor body 40 having a main horizontal surface 15, a back surface 16 arranged opposite to the main horizontal surface 15, a first semiconductor region 1 of a first conductivity type which extends to the main horizontal surface 15, a second semiconductor region 2 of the first conductivity type which extend to the back horizontal surface 16, and a third semiconductor region 3 of a second conductivity type which forms a first pn-junctions 5 with the first semiconductor region 1. A second pn-junction 9 is formed and/or arranged between the second semiconductor region 2 and the third semiconductor region 3. A first metallization 11 is in ohmic contact with the first semiconductor region 1. A second metallization 12 is in ohmic contact with the second semiconductor region 2. A lateral groove 21 extends from a lateral edge or side into the semiconductor body 40 and typically adjoins the first and second pn-junction 5, 9. An insulating plug 6 is arranged on the lateral groove 21. A semi-insulating region 7 is arranged on the insulating plug 6 and spaced apart from the semiconductor body 40 by the insulating plug 6. The semi-insulating region 7 electrically connects the first metallization 11 with the second metallization 12.

Since the voltage drops substantially linear along the resistor formed by the semi-insulating region 7, the electric field distribution during operation of semiconductor device 300 is typically changed such that the blocking voltage of semiconductor device 300 is increased and/or the drift of the blocking voltage reduced. Accordingly, the function of the edge-termination structure 10 of semiconductor device 300 is similar to the function of the edge-termination structures 10 of semiconductor devices 100 and 200.

Figure 5:
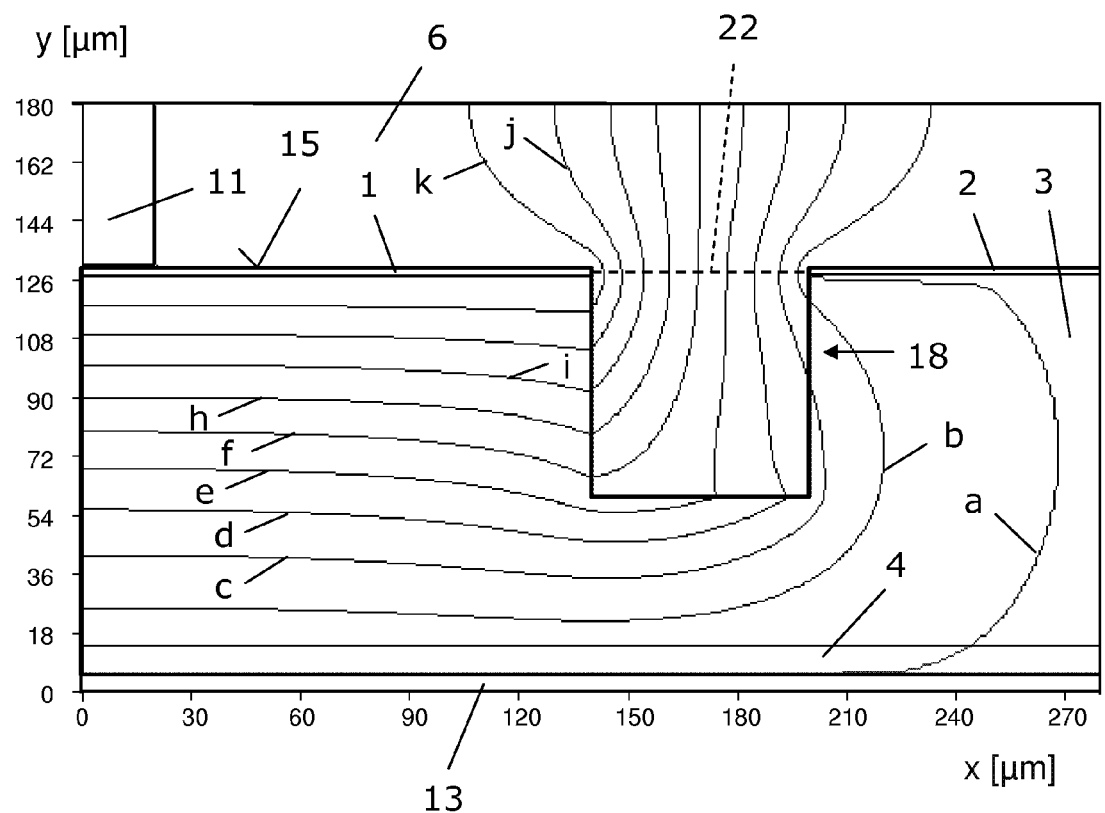

FIG. 5 schematically illustrates an electric potential distribution in a vertical cross-section of a vertical semiconductor device which is similar to semiconductor device 100 illustrated in FIG. 1, however without the semi-insulating region 7 arranged on the dielectric region 6. For reason of clarity, FIG. 5 corresponds only to a section of the peripheral area. The second metallization is not shown. FIG. 5 illustrates, as solid lines a to k, equipotential lines of an electric field that forms in blocking mode, i.e. when the pn-junction formed between the first semiconductor region 1 and the third semiconductor region 3 is reversely biased. The mutual distance between the equipotential lines is a measure of the field strength of the electric field. The field strength is all the higher, the smaller the distance between two adjacent equipotential lines. As can be seen from the profile of the equipotential lines, electric field strength is not increased close to the main horizontal surface 15. A detailed analysis reveals that the breakdown occurs in an upper left region of the third semiconductor region 3, i.e., in the bulk.

Equipotential lines of FIG. 5 correspond to a voltage of about 1.8 kV. In other words, the semiconductor device of FIG. 5 corresponds to a power semiconductor device. To achieve high blocking voltages, the vertical trench 18 extends typically 50 μm or more into the semiconductor body. Furthermore, vertical trench 18 has typically a width of 50 μm or more. Accordingly, the trench volume is comparatively high. Therefore, forming of dielectric region 6 typically includes spin-coating or a spraying method as explained below with reference to FIGS. 8 to 16 in more detail. The illustrated equipotential lines of FIG. 5 correspond however to an idealized situation with a homogeneous dielectric region 6 without trapped charges. The influence of trapped charges is explained with respect to FIG. 6.

Figure 6:
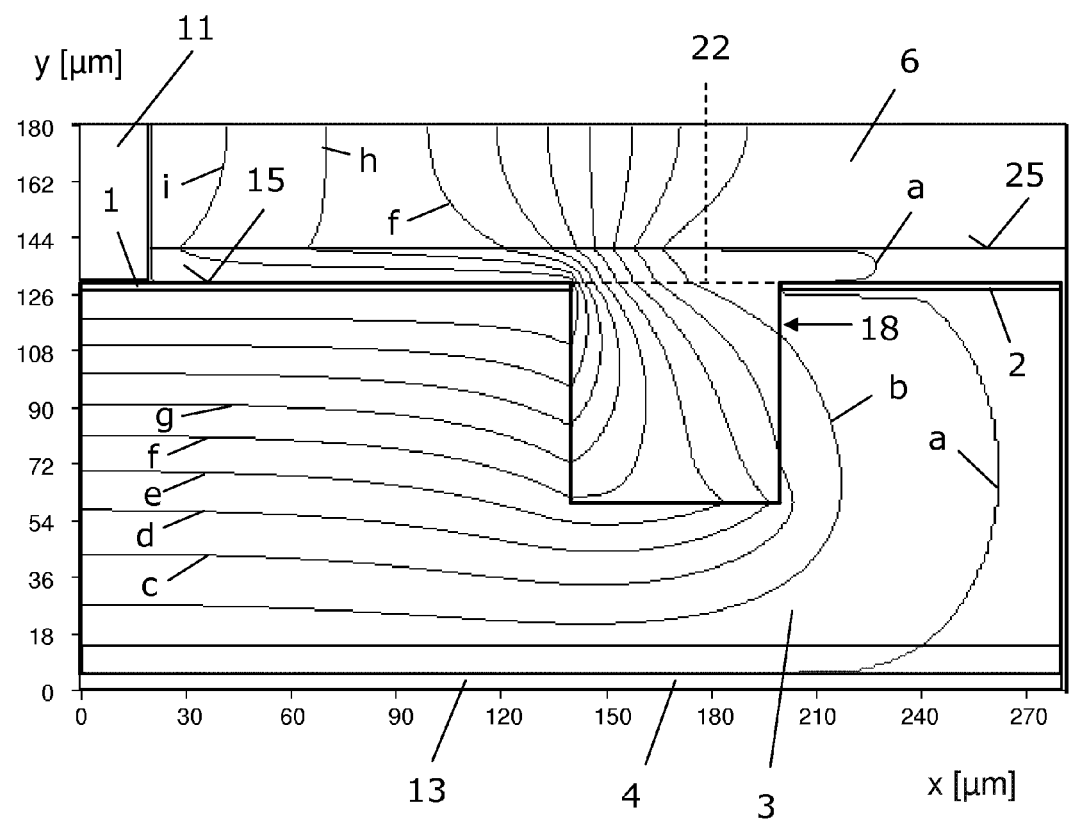
FIG. 6 schematically illustrates an electric potential distribution in a vertical cross-section of a vertical semiconductor device.

FIG. 6 schematically illustrates an electric potential distribution in a vertical cross-section of a vertical semiconductor device which is similar to semiconductor device illustrated in FIG. 5. For the simulation illustrated in FIG. 6 it was, however, assumed that a positive surface charge with a surface charge carrier density of about $7*10^{11}$ cm$^{-2}$ is trapped in the insulating region 6 at a plane 25 which is about 10 μm above main horizontal surface 15. Trapping of charges may occur during manufacturing and/or by entrapping of hot charge carriers during operation of the semiconductor device. FIG. 6 also illustrates, as solid lines a to h, equipotential lines of an electric field that forms in blocking mode. As can be inferred from the comparison with FIG. 5, the electric field distribution is significantly changed due to the presence of surface charges. A detailed analysis reveals that the breakdown voltage is reduced below 1.6 kV and that the breakdown occurs at the left lateral wall of trench 18. Furthermore, the maximum field strength in dielectric region 6 increases to values above 165 MV/m which would result in breakdown of dielectric polymers such as SU8. Note that the breakdown voltage is already significantly reduced for much lower surface charges carrier densities of about $7*10^{10}$ cm$^{-2}$. In addition, electric potential distribution was obtained in a static simulation. Field strength may, however, become even higher in dynamic situations.

When a semi-insulating region is arranged on the dielectric region 6, the charges of charged layers formed during manufacturing above the semi-insulating region are shielded and thus the reduction of break down voltage due to charge entrapment during manufacturing may be avoided. In other words, the break down voltage of a semiconductor device with a semi-insulating region on the dielectric region 6 is increased. Furthermore, the small current flow through the semi-insulating region results in smoothing the electric field distribution so that the electric field is substantially uniform distributed in the dielectric region 6. Accordingly, the semiconductor device is less prone to a drift of the breakdown voltage during operation, which may otherwise occur due to the entrapment of hot charge carriers. The shielding and smoothing effect of semi-insulating region increases with its vertical extension and its conductivity which is inversely related to the resistivity. However, the leakage current typically also increases with the conductivity and the height of the semi-insulating region. A good trade-off is, depending on vertical extension, typically found for a resistivity of the semi-insulating of about $10^3$ Ohm cm to about $10^{14}$ Ohm cm. The vertical extension of the semi-insulating region is typically in a range of about 10 nm to about 10 μm, more typically in range of about 100 nm to about 1 μm.

Figure 7:
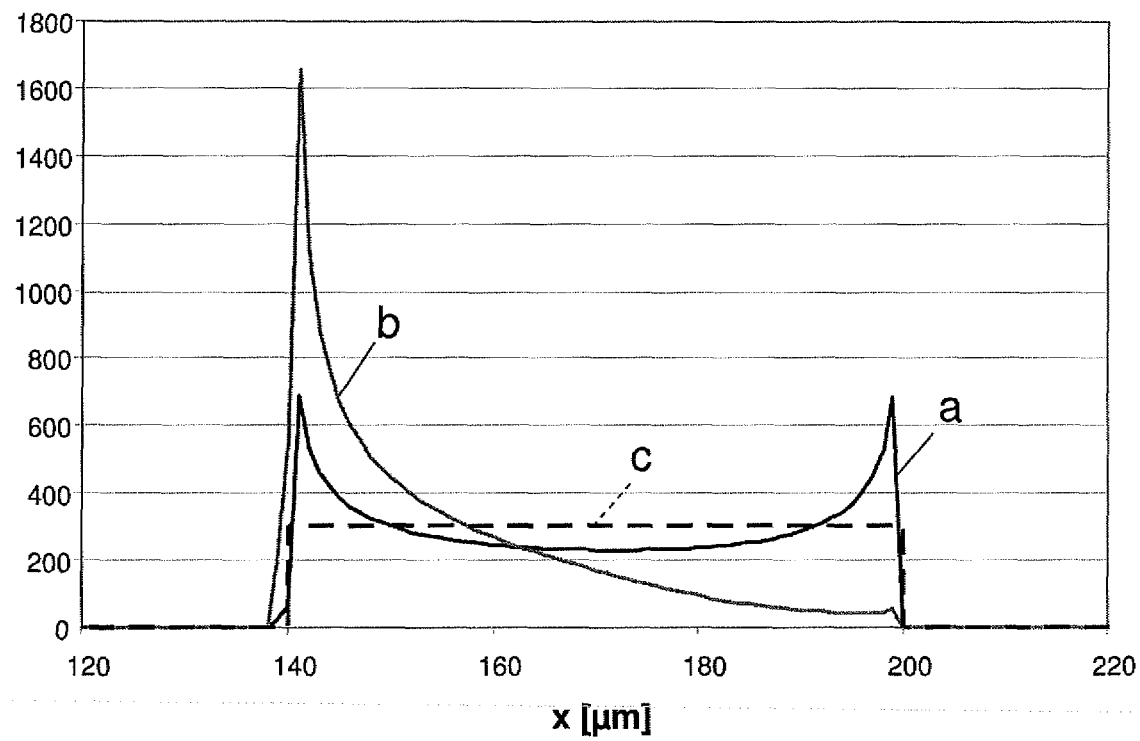
FIG. 7 schematically illustrates electric field distributions of vertical semiconductor devices according to one or more embodiments.

FIG. 7 schematically illustrates electric field distributions of vertical semiconductor devices. Curves a and b correspond to electric field strength along the dashed lines 22 in FIG. 5 and FIG. 6, respectively. This illustrates quantitatively that the electric field strength is typically substantially increased in blocking mode by trapped charges in dielectric layer close to the main horizontal surface. Dashed curve c corresponds to a situation which can be achieved by a semi-insulating region which is arranged next to the main horizontal surface. Typically, the semi-insulating region is spaced apart from the main horizontal surface by more than about 1 μm and less than about 50 μm. For example, the semi-insulating region is spaced apart from the main horizontal surface by about 10 μm. Accordingly, the electric field in the insulating plug is in a horizontal plane close to the main horizontal surface substantially constant when the pn-junction is reversely biased. This is achieved by the linear potential drop in the above arranged semi-insulating region. Within this specification, the term of a "substantially constant electric field" intends to describe that the electric field changes less than less than a factor of two, more typically less than about 50%, even more typically less than about 20%.

Figure 8:
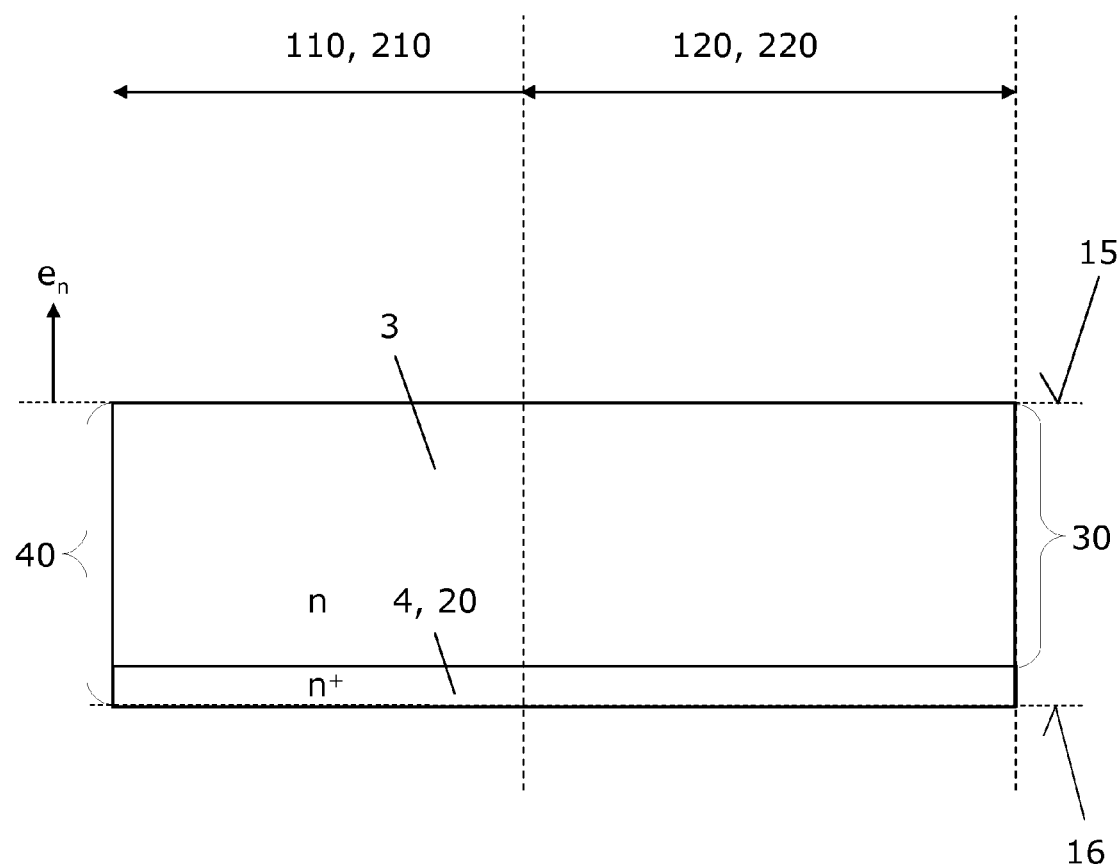
FIGS. 8 to 16 schematically illustrate manufacturing processes according to one or more embodiments.

With respect to FIGS. 8 to 16 methods for forming a semiconductor device 100, 200 according to several embodiments are illustrated. In a first process, a semiconductor body 40, typically a wafer or substrate 40 is provided. As illustrated in FIG. 8, semiconductor body 40 has an n-type semiconductor layer 3 which extends to a main horizontal surface 15. Typically, the wafer 40 further includes an n$^+$-type semiconductor layer 4 which extends between the n-type semiconductor layer 3 and a back surface 16 which is arranged opposite to main horizontal surface 15. The n$^+$-type semiconductor layer 4 typically forms a contact region 4 in the manufactured semiconductor device. When an IGBT is manufactured, semiconductor layer 4 is typically of p$^+$-type. Parts of the n-type semiconductor layer 3 may form a base region 3 or drift region 3 in the manufactured semiconductor device. In FIG. 8 only the upmost right part of the semiconductor device 100, 200 is illustrated with a peripheral area 120, 220 and an active area 110, 210 further extending to the left. The peripheral area 120, 220 typically circumferentially surrounds the active area 110, 120 in a horizontal cross-section.

Figure 9:
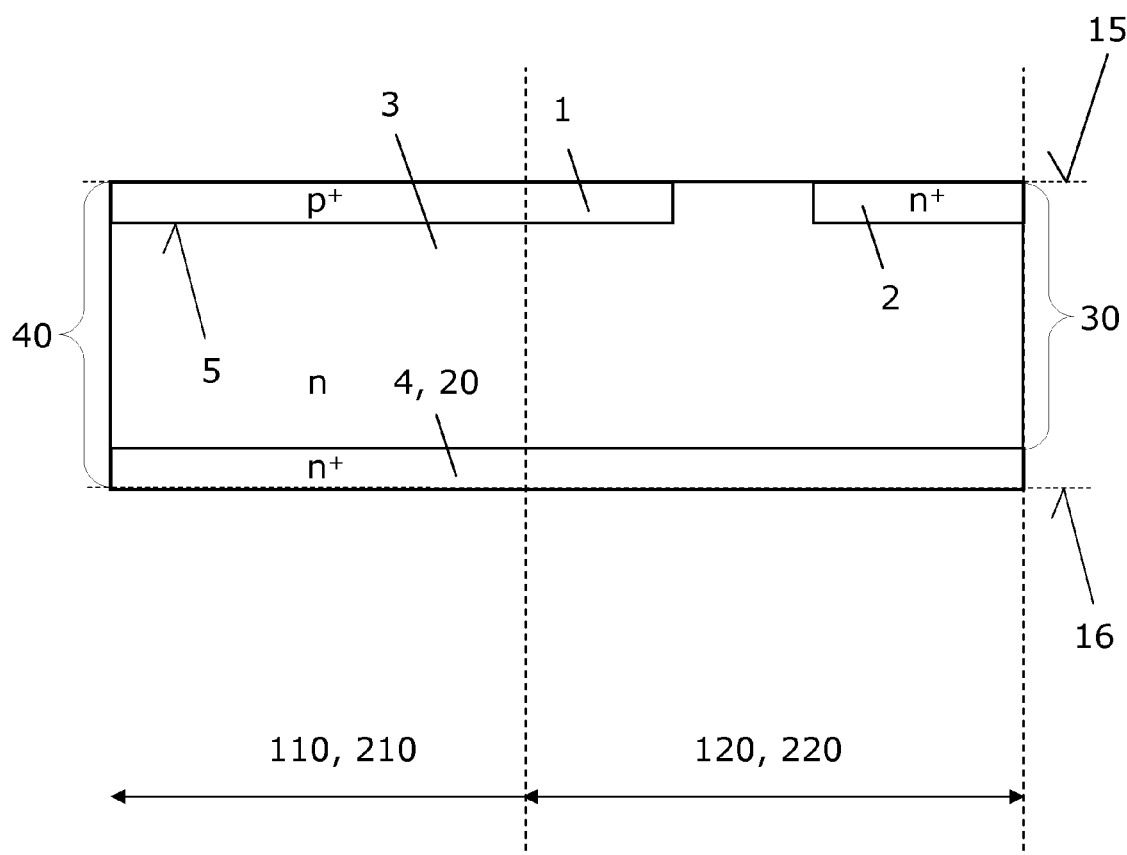

A p$^+$-type first semiconductor region 1 is formed e.g. by masked ion implantation. In so doing, a pn-junction 5 is formed between the first semiconductor region 1 and the n-type semiconductor layer 3. Further, an n$^+$-type second semiconductor region 2 is typically formed by masked ion implantation. The first semiconductor region 1 and the second semiconductor region 2 are formed such that they extent to the main horizontal surface 15. The resulting semiconductor structure 100, 200 is illustrated in FIG. 9.

Figure 10:
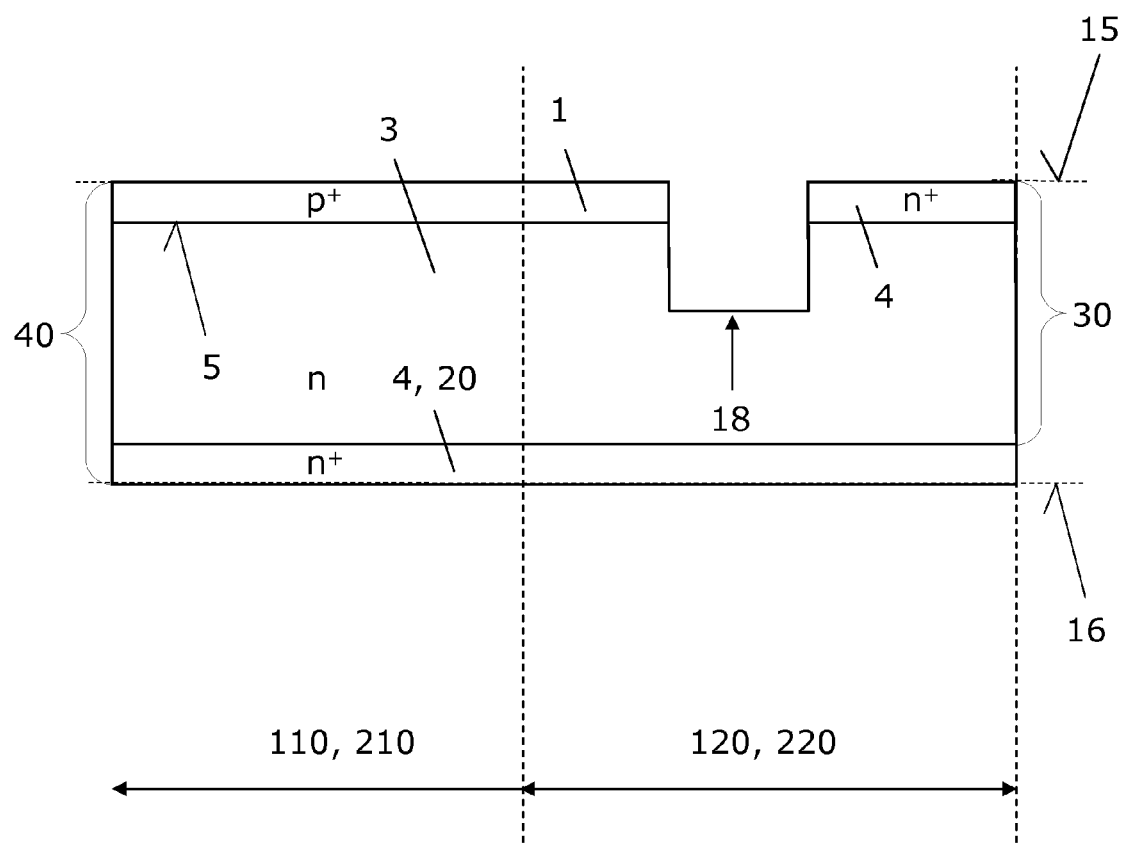

A vertical trench 18 is formed. The vertical trench 18 extends from the main horizontal surface 15 into the semiconductor body 40 and below the pn-junction 5. The resulting semiconductor structure 100, 200 is illustrated in FIG. 10. The width and vertical extension of trench 18 are typically larger than about 50 μm in case a power semiconductor device is formed.

The processes described with reference to FIGS. 8 to 10 may also be described as a process of providing a semiconductor body 40 having a main horizontal surface 15, a horizontally extending pn-junction 5, and a vertical trench 18 which extends from the main horizontal surface 15 below the horizontally extending pn-junction 5.

Figure 11:
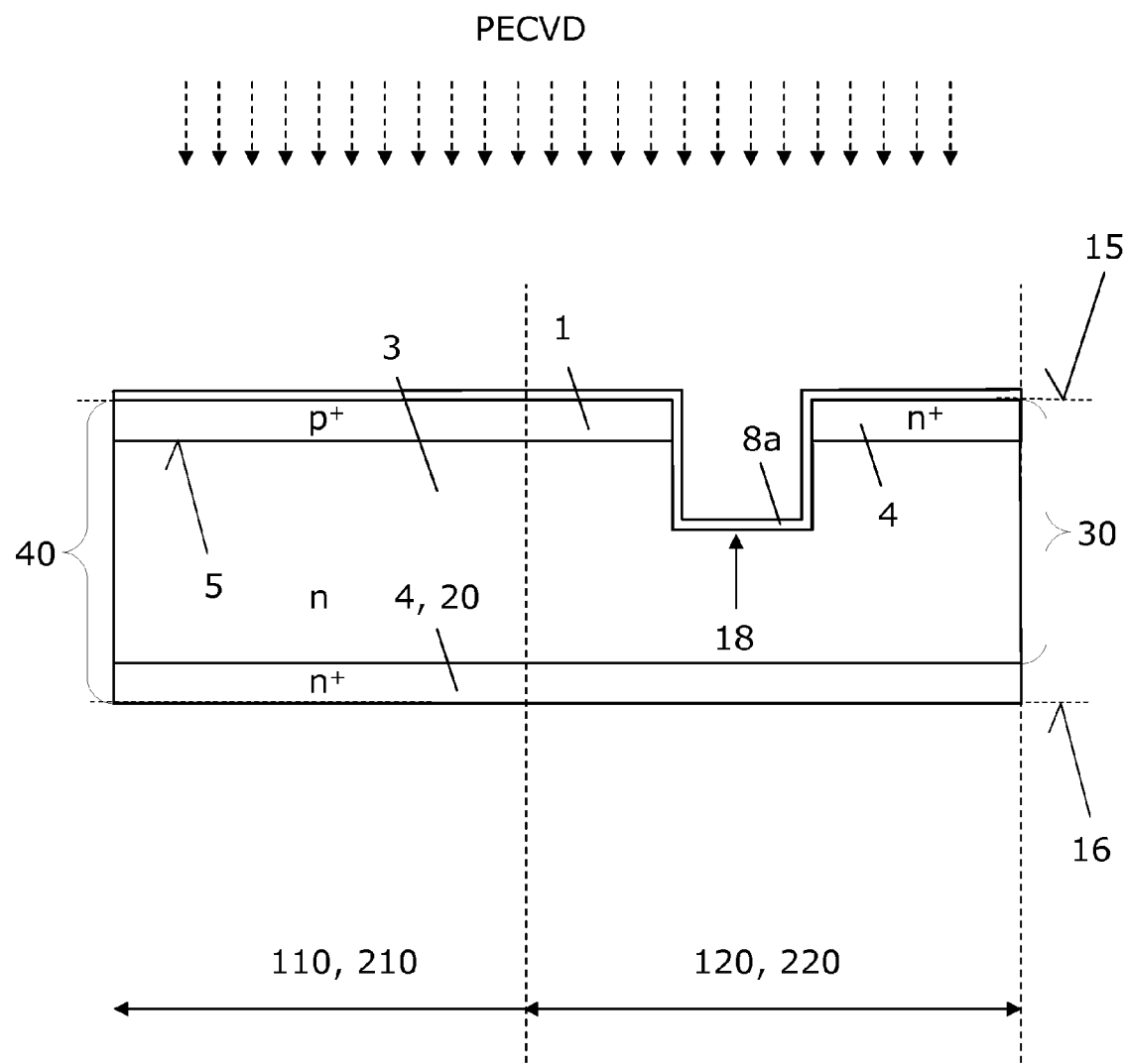

An optional process of forming a conformal layer 8a may be performed. Conformal layer 8a may, depending on application, be formed by plasma enhanced chemical vapor deposition (PECVD) as a dielectric layer 8a or a semi-insulating layer 8a. In case of a dielectric layer 8a and a silicon semiconductor body 40, dielectric layer 8a may also be formed as thermal oxide. The resulting semiconductor structure 100, 200 is illustrated in FIG. 11.

Figure 12:
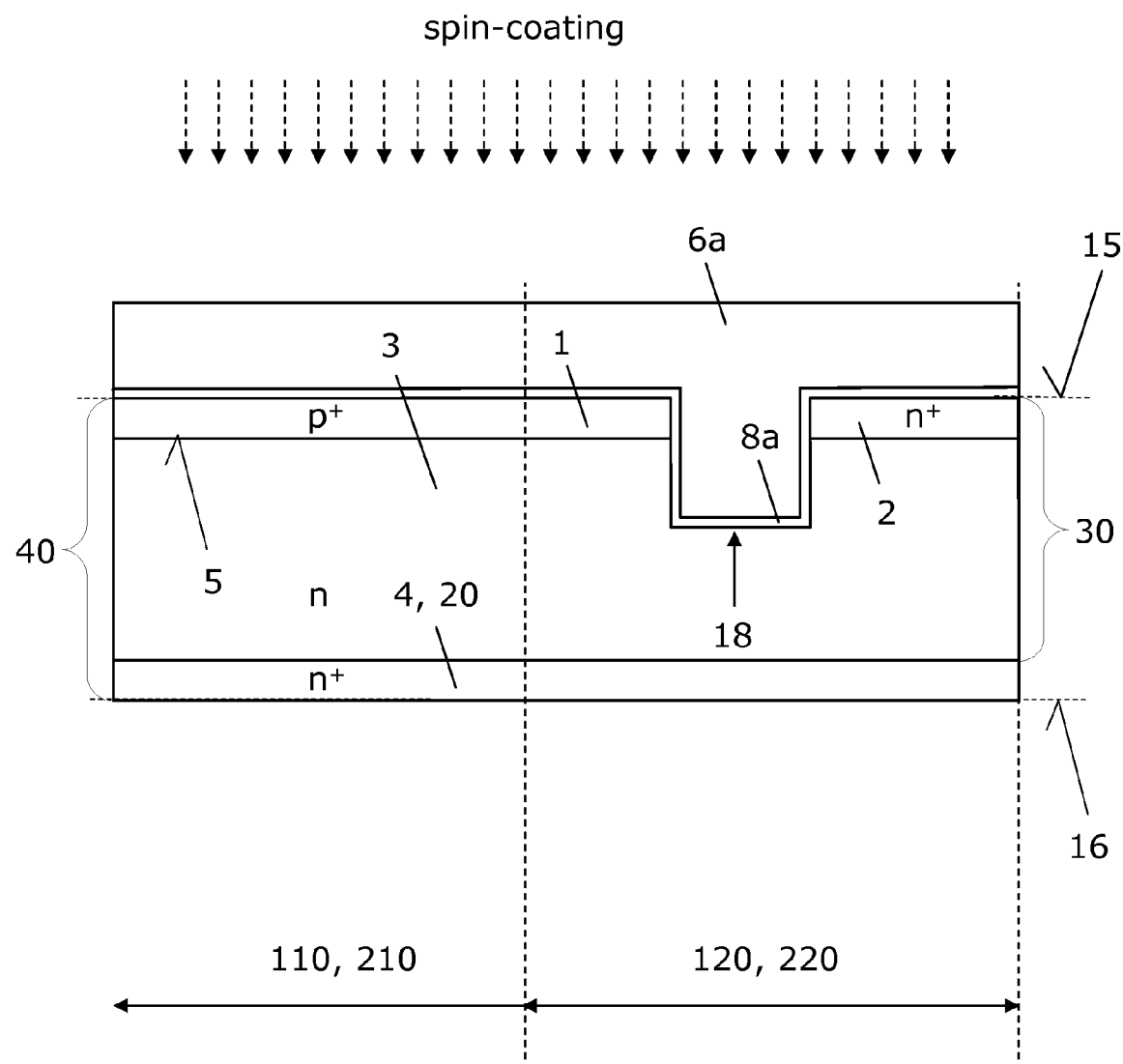

A dielectric layer 6a is formed on the main horizontal surface 15 such that the vertical trench 18 is at least completely filled. Typically, dielectric layer 6a covers also main horizontal surface 15. According to an embodiment, dielectric layer 6a is formed by spin-coating, ink-jet printing and/or stencil printing. In so doing, the comparatively deep and wide trench 18 may efficiently be filled with a dielectric material, typically a polymer which is cured thereafter. Dielectric layer 6a may, however, also be formed by chemical vapor deposition (CVD). The resulting semiconductor structure 100, 200 is illustrated in FIG. 12.

Dielectric layer 6a is typically made of a cured epoxy resin such as SU8, a silicone, a spin-on glass, an imide such as a polyimide, a parylene and a polymerized benzocyclobutene such as Cyclotene 3000. These materials do not or almost not shrink during curing. Accordingly, dielectric layer 6a is typically formed without voids. Thus, partial discharge processes during operation of the semiconductor device may be avoided or at least reduced. Furthermore, these materials have a good moisture resistivity. Accordingly, the semiconductor device is protected against penetrating moisture.

Figure 13:
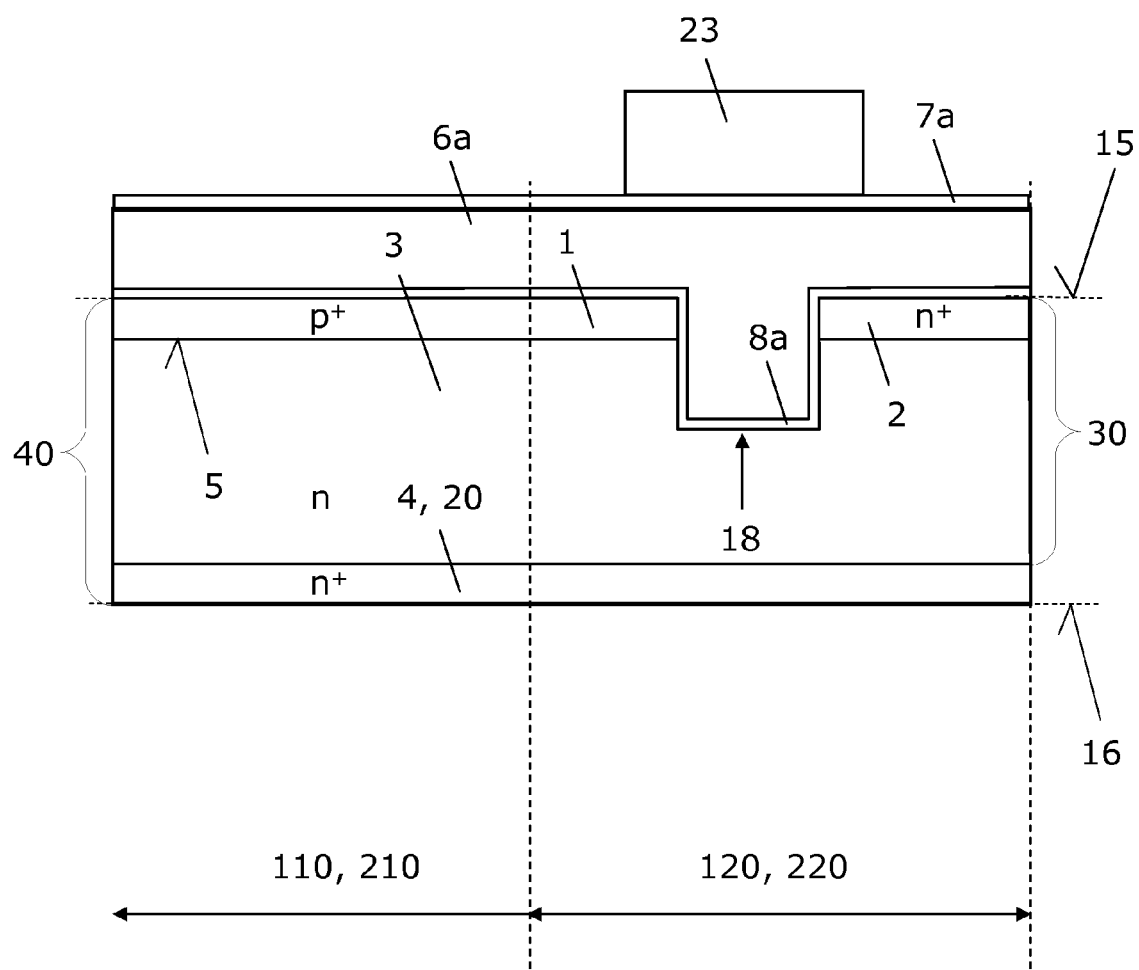

A second layer 7a is formed, typically in a CVD process, on dielectric layer 6a. Second layer 7a is selectively etchable from the dielectric layer 6a. Accordingly, portions of the second layer 7a may later form a hard mask. The resulting semiconductor structure 100, 200 is illustrated in FIG. 13.

According to an embodiment, the second layer 7a is made of a semi-insulating material, typically an amorphous semiconductor material, a polycrystalline semiconductor material or a nanocrystalline semiconductor material. Examples of such materials include diamond-like carbon, an amorphous hydrogenated silicon carbide, amorphous hydrogenated silicon, and non-monocrystalline silicon carbide $Si_xC_{1-x}$ with $0<=x<=1$. Accordingly, second layer 7a may form a barrier for charges which may otherwise be formed in or on dielectric layer 6a during later processes. For example, subsequent etching processes may result in positive surface charges of an unprotected dielectric layer 6a due to remaining alkali ions. This in turn, may reduce the break-down voltage as explained with reference to FIGS. 5 to 7.

The resistivity of the second layer 7a is typically in a range from about $10^3$ Ohm cm to about $10^{14}$ Ohm cm, more typically in a range from about $10^6$ Ohm cm to about $10^{12}$ Ohm cm. Due to later electrical contacting a remaining portion of second layer 7a above trench 18, any remaining surface charges above the remaining portion may be shielded. Furthermore, a linear potential profile may be applied via the remaining portion of second layer 7a. Accordingly, the field distribution in blocking mode of the semiconductor device is improved so that the blocking voltage is further increased and/or the drift during the life time of the semiconductor device reduced. Diamond-like carbon may be deposited at temperatures which are comparatively low, e.g. not much above room temperature. Accordingly, many polymers such as polymerized benzocyclobutene used for the dielectric layer 6a are not altered during forming the second layer 7a.

A photolithographically structured mask 23 is typically formed above trench 18. The resulting semiconductor structure 100, 200 is illustrated in FIG. 13.

Figure 14:
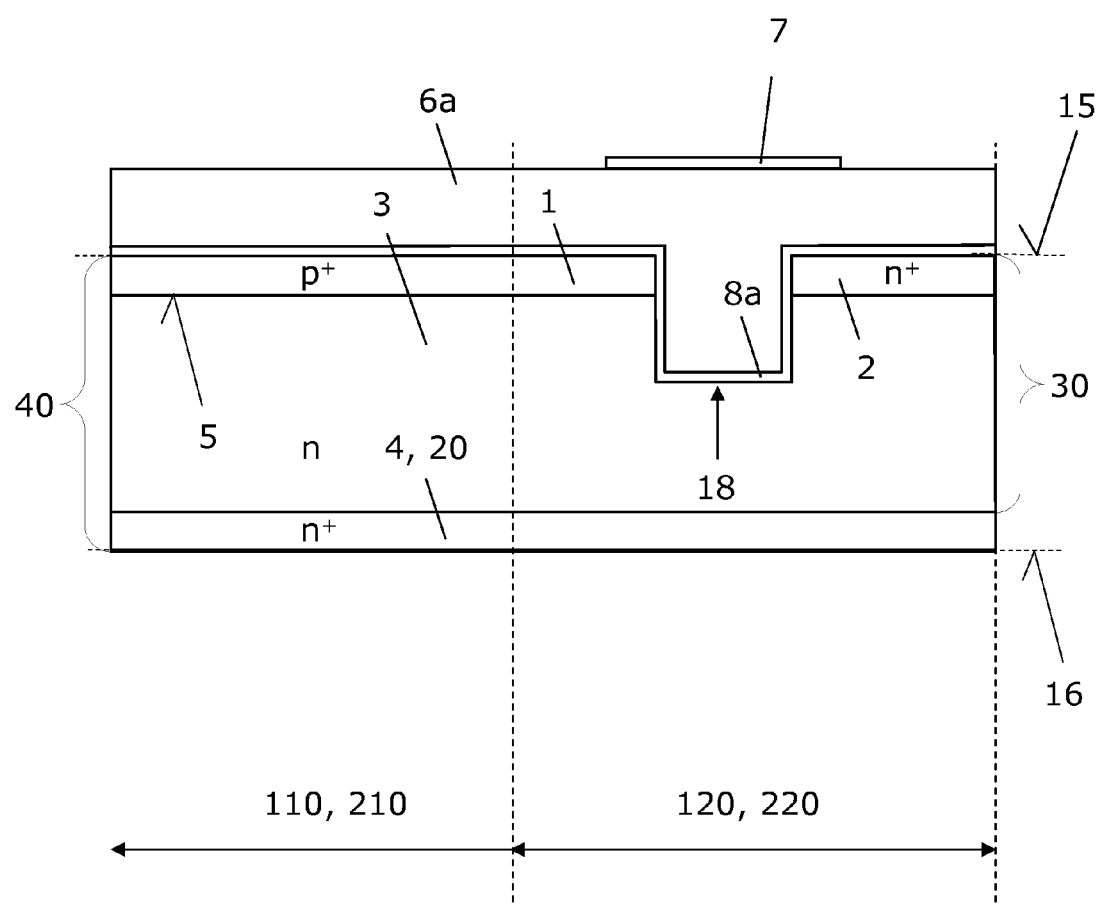

A mask or hard mask 7 is formed above vertical trench 18, typically by reactive ion etching (RIE) of the second layer 7a. The resulting semiconductor structure 100, 200 is illustrated in FIG. 14.

Figure 15:
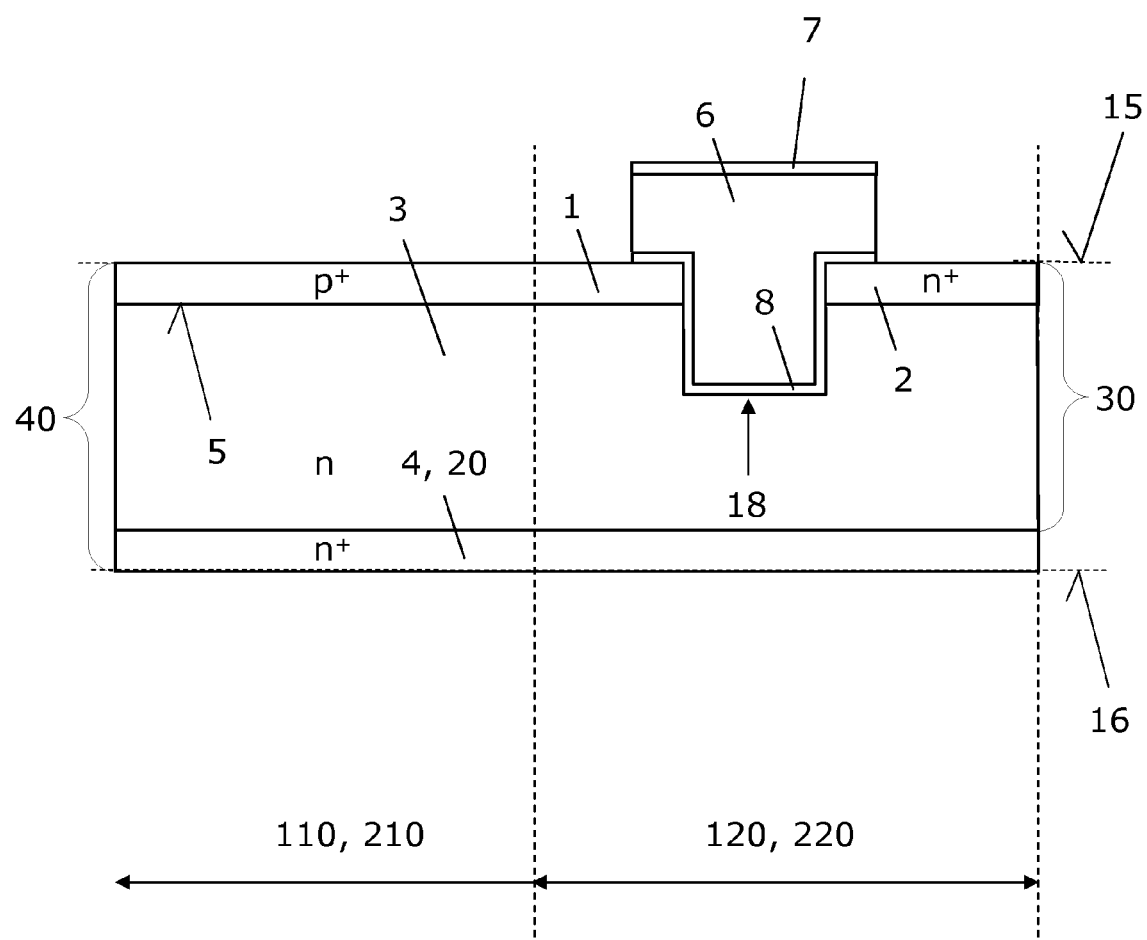

Dielectric layer 6a is etched back using the mask 7. The resulting semiconductor structure 100, 200 is illustrated in FIG. 15. Back-etching of dielectric layer 6a may be performed as dry or wet etching process.

When dielectric layer 6a is formed by spin coating, dishing is typically not completely avoided. Due to the comparatively large dimensions of trench 18, dielectric layer 6a may protrude up to about 10 µm or even up to about 20 µm in the center of the semiconductor device 100, 200. Due to using mask 7 for structuring dielectric layer 6a, chemical mechanical polishing (CMP) to remove the dishing is typically avoided or at least reduced. This is particularly important for polymers which have low removal rates of about 100 nm/min during a CMP process. Accordingly, processing time is typically significantly reduced by etching dielectric layer 6a through mask 7. Depending on dishing, a CMP process may still be carried out to reduce the dishing prior to forming the second layer 7a, but for a shorter time compared to completely removing the dishing.

Mask 7 may be removed. In the following figures, embodiments with a remaining mask 7 forming a semi-insulating region 7 are explained.

Figure 16:
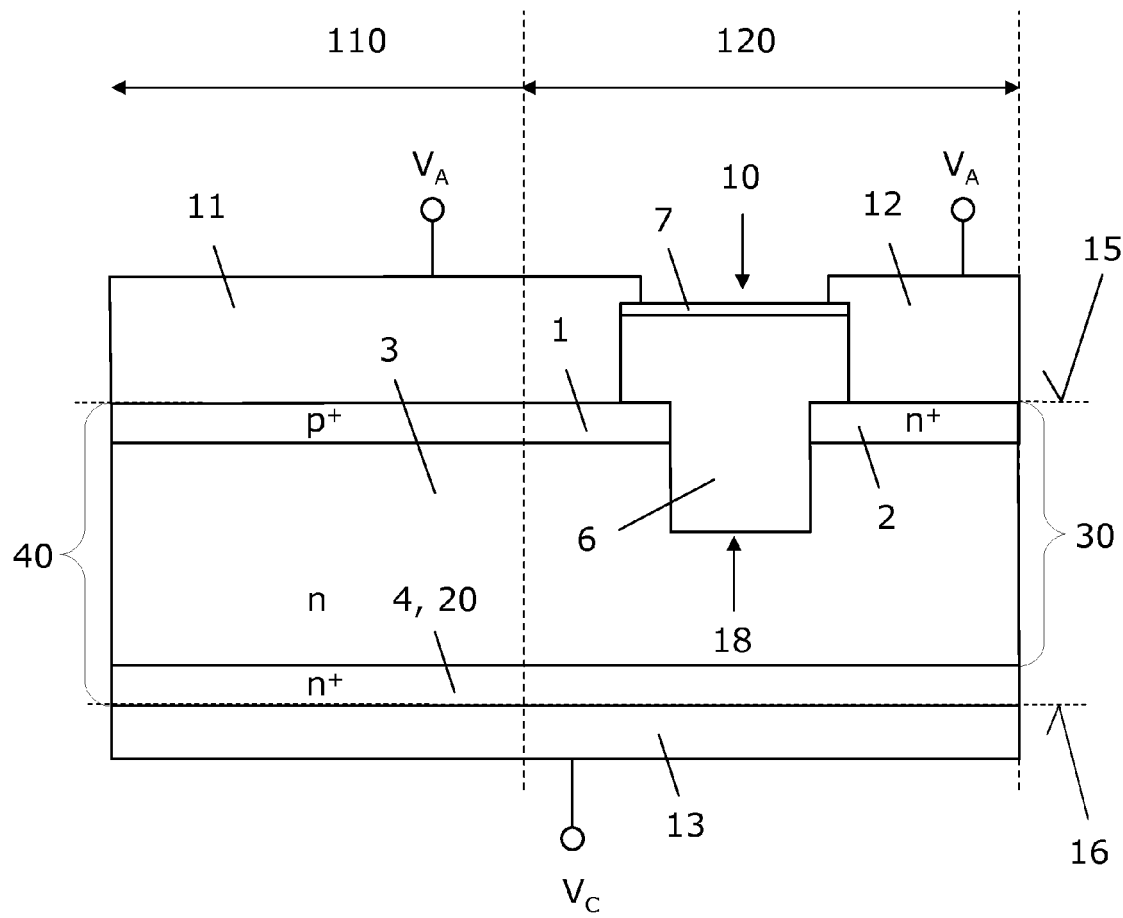

A first conductive region 11 and a second conductive region 12 are formed on the main horizontal surface 15 such that the first conductive region 11 and the second conductive region 12 are electrically connected by a resistor formed by the mask 7. The resulting semiconductor structure 100 is illustrated in FIG. 16. Semiconductor structure 100 of FIG. 16 corresponds to a sequence of processes without the optional process of forming conformal layer 8a as explained with reference to FIG. 11. When this optional process is performed, a semiconductor device 200 as illustrated in FIG. 2 is manufactured.

Figure 17:
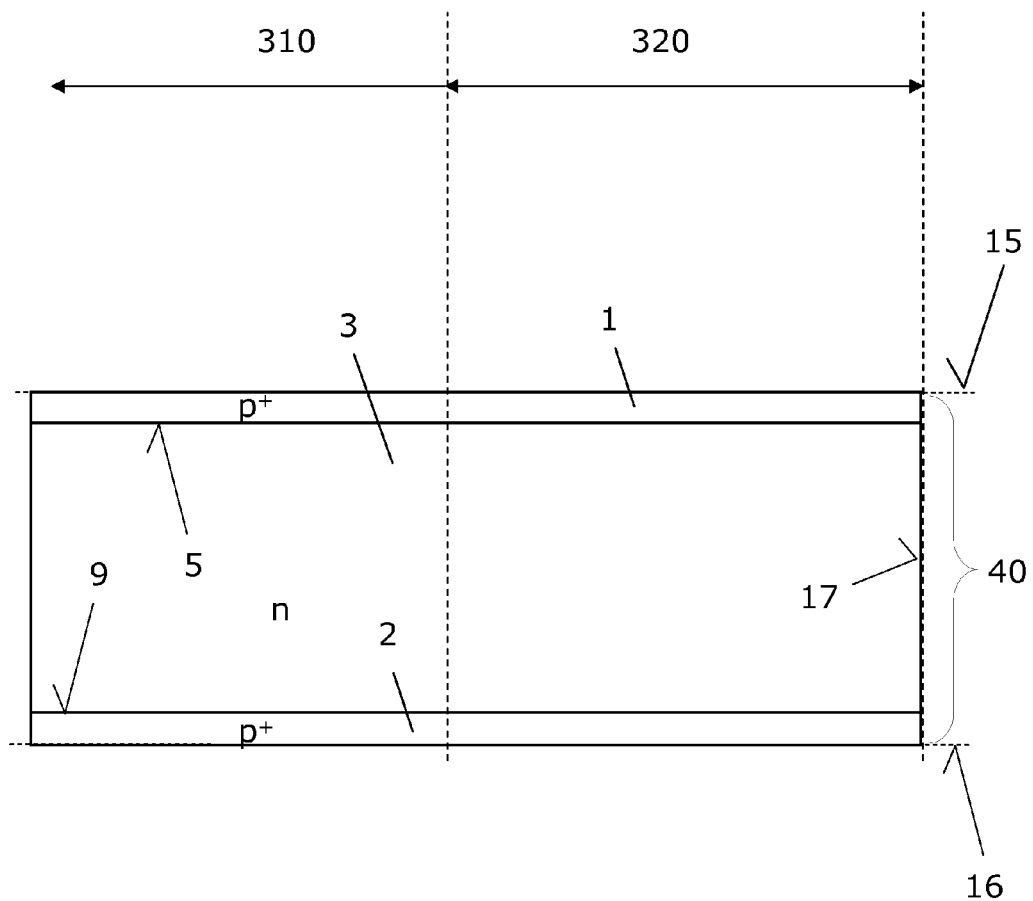
FIGS. 17 to 19 schematically illustrate manufacturing processes according to one or more embodiments.
Figure 18:
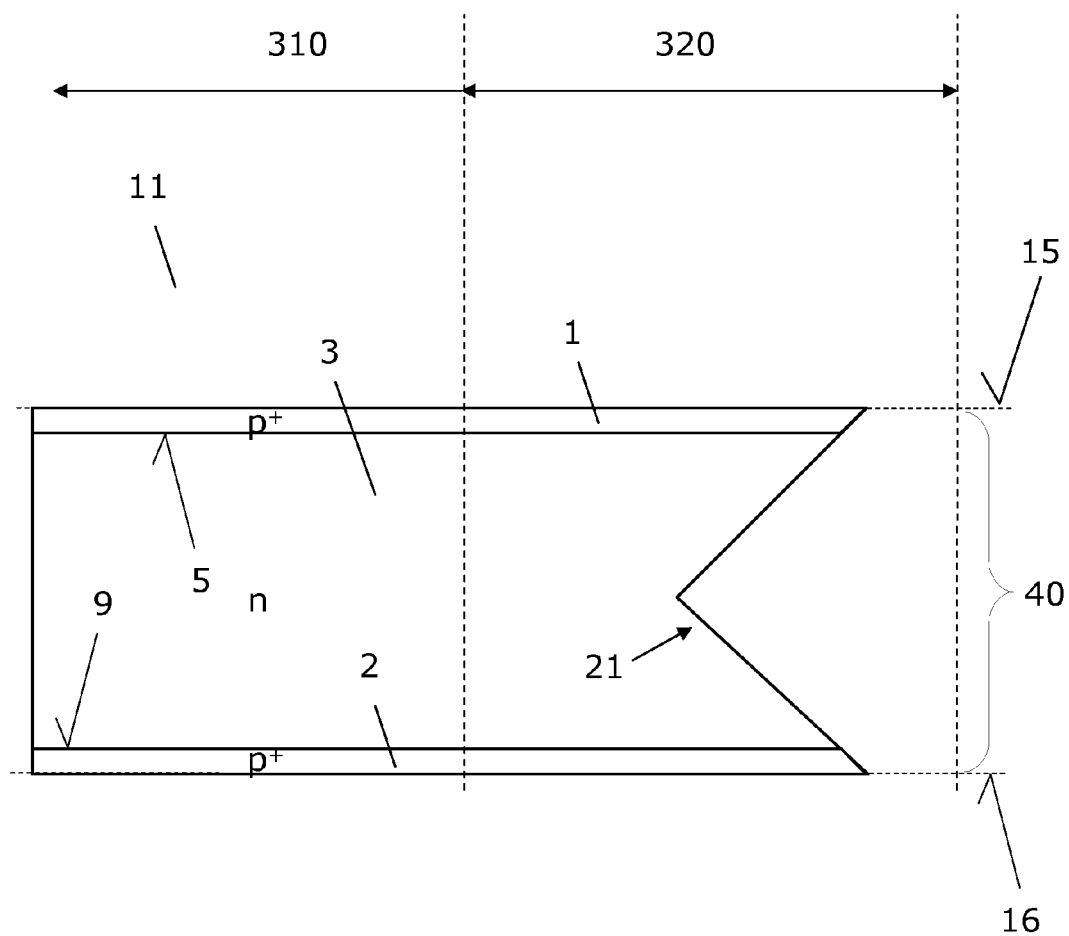
Figure 19:
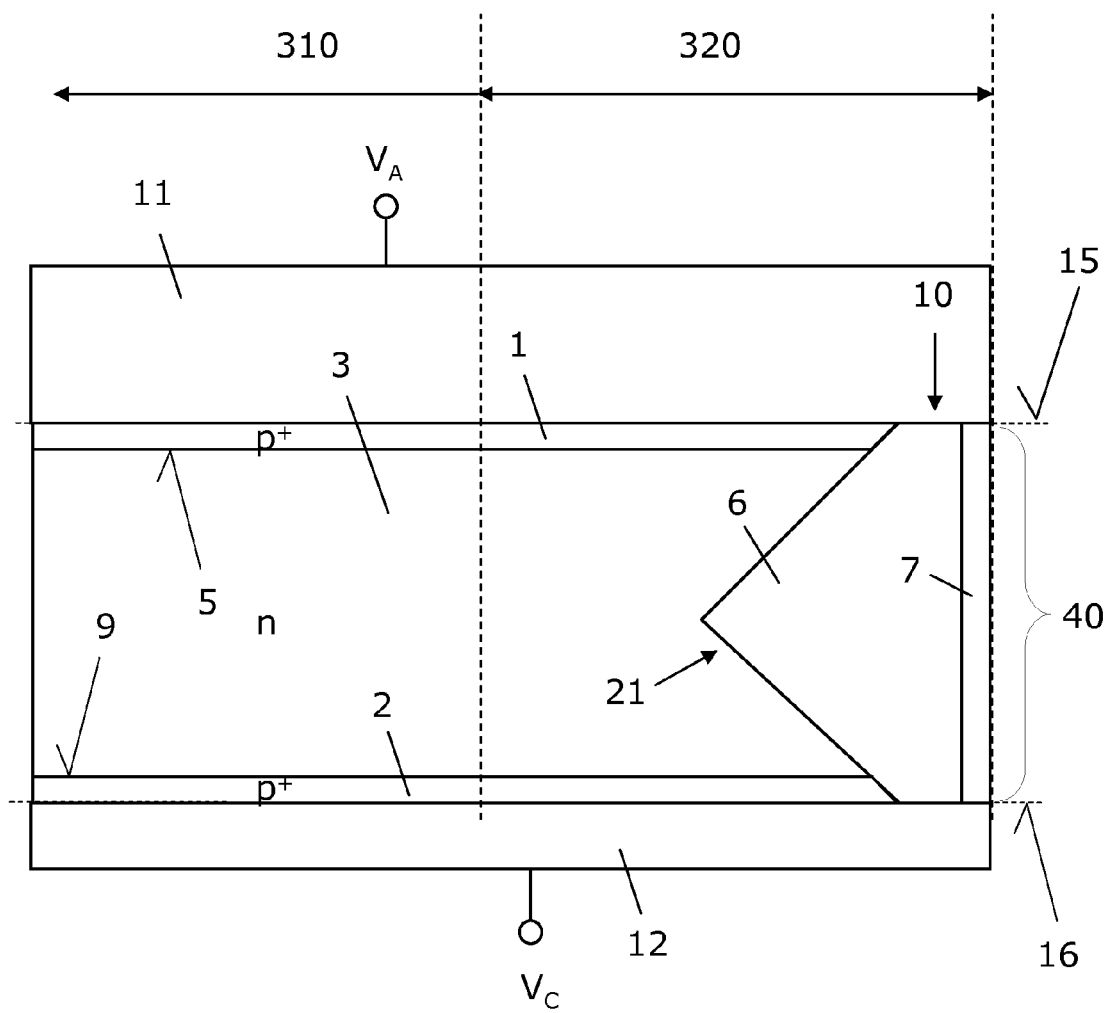

With respect to FIGS. 17 to 19 further methods for forming a semiconductor device 300 according to several embodiments are illustrated. In a first process, a semiconductor body 40, typically a wafer 40 or substrate 40 is provided. As illustrated in FIG. 17, semiconductor body 40 has a $p^+$-type first semiconductor region 1 and a $p^+$-type second semiconductor region 2 which are spaced apart from each other by an $n^+$-type third semiconductor region 3. The third semiconductor region 3 forms a first pn-junction 5 and a second pn-junction 9 with the first semiconductor region 1 and the second semiconductor region 2, respectively. The first semiconductor region 1 extends to a main horizontal surface 15. The second semiconductor region 2 extends to a back surface 16 which is arranged opposite to main horizontal surface 15.

A v-shaped groove 21 is laterally formed at a sawing edge 17 of the semiconductor body 40 into the semiconductor body 40. V-shaped groove 21 may be formed by grinding, sand blasting, lapping, etc. The resulting semiconductor structure 300 is illustrated in FIG. 18. FIG. 18 illustrates only the upmost right part of semiconductor device 300. An active area 310 typically extends further to the left. A peripheral area 320 typically circumferentially surrounds the active area 310 in a complete horizontal cross-section of which FIG. 18 only illustrates a right section.

A dielectric plug 6 is formed in the v-shaped groove 21 which protrudes out of the v-shaped groove 21. Further, a semi-insulating region 7 is formed on the dielectric plug 6. A first metallization 11 is formed in ohmic contact with the first semiconductor region 1 and the semi-insulating region 7, and a second metallization 12 is formed in ohmic contact with the second semiconductor region 2 and the semi-insulating region 7. The resulting semiconductor structure 300 is illustrated in FIG. 19.

The resistivity of the semi-insulating region 7 is typically in a range from about $10^3$ Ohm cm to about $10^{14}$ Ohm cm, more typically in a range from about $10^6$ Ohm cm to about $10^{12}$ Ohm cm. In so doing, an edge-termination 10 is formed in the peripheral area 320 of semiconductor device 300 which ensures a high blocking capability. Edge-termination 10 of semiconductor device 300 may also be described as a double positive bevelled edge-termination 10 with an additional semi-insulating layer 7 forming a resistor. The resistor is connected in parallel to a current path which is arranged in semiconductor body 40 between the first semiconductor region 1 and the second semiconductor region 2, and which runs across the pn-junctions 5 and 9.

The methods explained herein typically include providing a semiconductor body with a first semiconductor region and a second semiconductor region which are spaced apart from each other. An insulating region is formed such that the insulating region extends between the first semiconductor region and the second semiconductor region. A semi-insulating region with a resistivity of about $10^3$ Ohm cm to about $10^{14}$ Ohm cm is formed on the insulating region such that the semi-insulating region is spaced apart from the semiconductor body. A first metallization is formed in ohmic contact with the first semiconductor region and the semi-insulating region. A second metallization is formed in ohmic contact with the second semiconductor region and the semi-insulating region. The insulating region may be formed in a trench extending from a main horizontal surface into the semiconductor body or a groove which extends from a sawing edge or lateral edge of the semiconductor body into the semiconductor body Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a semiconductor body comprising a diode-structure with a pn-junction; and
an edge-termination structure arranged in a peripheral area of the semiconductor body, the edge-termination structure comprising:
an insulating region partially arranged in the semiconductor body adjacent the pn-junction; and
a semi-insulating region arranged on the insulating region and spaced apart from the semiconductor body, the semi-insulating region forming a resistor connected in parallel with the diode-structure,
wherein the resistor has a resistance higher than about 1 kOhm.

2. The semiconductor device of claim 1, further comprising an anode metallization and a cathode metallization arranged on the semiconductor body and electrically connected with each other by the semi-insulating region.

3. A semiconductor device, comprising:
a semiconductor body, comprising:
a main horizontal surface;
a first semiconductor region of a first conductivity type extending to the main horizontal surface;
a second semiconductor region of a second conductivity type extending to the main horizontal surface;
a vertical trench extending from the main horizontal surface into the semiconductor body and arranged between the first semiconductor region and the second semiconductor region; and
an insulating plug arranged in the vertical trench and extending beyond the main horizontal surface; and
a semi-insulating region arranged on the insulating plug and in ohmic contact with the first semiconductor region and the second semiconductor region, the semi-insulating region forming a resistor connected between the first semiconductor region and the second semiconductor region, the resistor having a resistance higher than about 1 kOhm.

4. The semiconductor device of claim 3, further comprising a third semiconductor region of the second conductivity type which forms a pn-junction with the first semiconductor region, wherein the vertical trench is arranged next to the pn-junction and extends partly into the third semiconductor region and below the pn-junction.

5. The semiconductor device of claim 4, further comprising:
a back surface arranged opposite to the main horizontal surface; and
a metallization arranged on the back surface in low ohmic contact with the second semiconductor region and the third semiconductor region.

6. The semiconductor device of claim 4, wherein the resistivity of the semi-insulating region is such that an electric field in the insulating plug in a horizontal plane close to the main horizontal surface is substantially constant when the pn-junction is reverse biased.

7. The semiconductor device of claim 3, comprising:
a first metallization in ohmic contact with the first semiconductor region and the semi-insulating region; and
a second metallization in ohmic contact with the second semiconductor region and the semi-insulating region.

8. The semiconductor device of claim 3, wherein the semi-insulating region has a resistivity of about $10^3$ Ohm cm to about $10^{14}$ Ohm cm.

9. The semiconductor device of claim 3, wherein the semi-insulating region comprises at least one of an amorphous semiconductor material, a polycrystalline semiconductor material, a nanocrystalline semiconductor material, a diamond-like carbon, an amorphous silicon carbide, an amorphous silicon, an amorphous hydrogenated silicon, and an amorphous hydrogenated silicon carbide.

10. The semiconductor device of claim 3, wherein the insulating plug comprises at least one of a cured epoxy resin, a silicone, a spin-on glass, an imide, a parylene, and a benzocyclobutene.

11. The semiconductor device of claim 3, wherein the insulating plug and the semi-insulating region form at least a part of an edge-termination structure.

12. The semiconductor device of claim 3, wherein the semiconductor device is a power semiconductor device.

13. A method for forming a semiconductor device, comprising:
providing a semiconductor body comprising a main horizontal surface, a horizontally extending pn-junction, and a vertical trench extending from the main horizontal surface below the horizontally extending pn-junction;

forming a dielectric layer on the main horizontal surface such that the vertical trench is at least completely filled, the dielectric layer being formed by at least one of spin-coating, ink-jet printing and stencil printing;

forming a second layer on the dielectric layer, selectively etching the second layer with respect to the dielectric layer to form a mask on the dielectric layer covering the vertical trench in a projection on the main horizontal surface; and back-etching the dielectric layer using the second layer as an etching mask.

14. The method of claim 13, wherein the second layer comprises a semi-insulating material.

15. The method of claim 13, wherein the second layer comprises at least one of an amorphous semiconductor material, a polycrystalline semiconductor material and a nanocrystalline semiconductor material.

16. The method of claim 13, wherein the resistivity of the second layer is in a range from about $10^3$ Ohm cm to about $10^{14}$ Ohm cm.

17. The method of claim 13, wherein the second layer comprises at least one of a diamond-like carbon, an amorphous silicon, an amorphous silicon carbide, an amorphous hydrogenated silicon, and an amorphous hydrogenated silicon carbide.

18. The method of claim 13, further comprising forming a first conductive region and a second conductive region on the main horizontal surface such that the first conductive region and the second conductive region are electrically connected by a resistor formed by the mask.

19. The method of claim 13, wherein the dielectric layer comprises at least one of a cured epoxy resin, a silicone, a spin-on glass, an imide, a parylene and a benzocyclobutene.

* * * * *